United States Patent [19]

Blanchard et al.

[11] 4,197,455

[45] Apr. 8, 1980

[54] METAL VAPOR SOURCE WITH A REGULATABLE FLOW AND TO AN ION ANALYZER EQUIPPED WITH SUCH A SOURCE

[75] Inventors: Bruno Blanchard, Grenoble; Patrick Carrier, Saint Egreve, both of France

[73] Assignee: Commissariat a l'Energie Atomique, Paris, France

[21] Appl. No.: 957,811

[22] Filed: Nov. 6, 1978

[30] Foreign Application Priority Data

Nov. 15, 1977 [FR] France ................................ 77 34272

[51] Int. Cl.² ........................ B01D 59/44; H01J 39/34
[52] U.S. Cl. ................................. 250/288; 250/423 R
[58] Field of Search .................... 250/423 R, 425, 288, 250/289; 73/23, 15

[56] References Cited

U.S. PATENT DOCUMENTS

| | | | |
|---|---|---|---|
| 2,789,299 | 4/1957 | Lawrence | 250/425 |
| 2,967,239 | 1/1961 | Zemany | 250/425 |
| 3,888,107 | 6/1975 | Langer et al. | 250/425 |

Primary Examiner—Bruce C. Anderson
Attorney, Agent, or Firm—Lane, Aitken & Ziems

[57] ABSTRACT

A metal vapor source with a regulatable flow rate comprising an enclosure filled with said vapor, means for heating said enclosure to a first temperature, a tube connected to the enclosure and means for heating said tube to a second regulatable temperature, the first temperature being maintained above the second temperature.

An ion analyzer comprising an enclosure in which is disposed a target to be analyzed, a lens for extracting secondary ions whose front face faces the target, an enclosure filled with an alkaline vapor, means for heating said enclosure to a first regulatable temperature, a vapor outflow tube connected to one end of the enclosure, while the other end penetrates the analyzer enclosure, traverses the extraction lens and assumes a position level with the front face of the extraction lens and means for heating said tube to a second regulatable temperature, the first temperature being kept above the second temperature of the outflow tube.

4 Claims, 3 Drawing Figures

METAL VAPOR SOURCE WITH A REGULATABLE FLOW AND TO AN ION ANALYZER EQUIPPED WITH SUCH A SOURCE

BACKGROUND OF THE INVENTION

The present invention relates to a metal vapor source with a regulatable flow and to an ion analyzer equipped with such a source.

In an ion analyzer, a sample to be analysed is bombarded with primary particles (argon ions for example) to bring about the emission of secondary ions (positive or negative) which are quantitatively analyzed. It is known that it is possible to exult and stabilize the emission rate of secondary ions by saturating the sample surface with oxygen (in the case of positive ions) or alkali (in the case of negative ions). However, the controlled introduction of an alkaline vapor into an ion analyzer causes problems which have not hitherto been satisfactorily solved. The general procedure involves bombardment of the sample with alkaline ions (e.g. cesium ions) or prior deposition of alkali on the sample.

The first solution requires a change of the primary ion source on passing from positive ions to negative ions. Moreover, as has been found in the case of positive ions saturation is not obtained and the exultation rates may vary considerably depending on the operating conditions of the source and the penetration depth of the alkaline ions into the target.

The second solution only permits maximum exultation at a given time and does not permit the performance of continuous analyses and in particular the plotting of profiles.

The present invention obviates these disadvantages by proposing a metal vapor source and in particular an alkaline vapor source which makes it possible to obtain a regulatable vapor flow rate and which is well adapted to ion analyzers. However, it is obvious that the improved source according to the invention can be used in fields other than ion analysis and in particular in ion implantation.

Metal vapor sources which can be used in spectrometry installations are already known. U.S. Pat. No. 2,967,239 granted on Jan. 3rd 1961 and entitled "Method and apparatus for Analyzing Constituents of a substance" describes an ion source, constituted by a chamber connected to an analysis enclosure by a vapor supply pipe. Heating means permit on the one hand the regulation of the metal vapor pressure in the chamber and on the other prevent any danger of condensation on the inner walls of the pipe. Thus, the temperature of the latter is always higher than the chamber temperature.

French Pat. No. 1,341,917 (PV919, 342) granted on Sept. 23rd 1963 and entitled "Device for Introducing a Gas Sample into an Analysis Apparatus" describes a metal vapor source mounted on an analysis apparatus. This source comprises a chamber and a pipe for introducing vapour into the apparatus. This pipe can be heated by circulation of a flow along its wall in order to prevent condensation. In this case, the temperature of the pipe is above the temperature of the chamber containing the metal vapor.

BRIEF SUMMARY OF THE INVENTION

The present invention runs counter to this teaching in that it proposes bringing the temperature of the supply pipe which is below and not above that of the chamber supplying it with vapor. Thus, not only is condensation no longer avoided, but it is used to regulate the vapor flow. This leads to a source whose vapor flow rate can be regulated with greater precision and speed than in the prior art.

More specifically, the invention relates to a metal vapor source with a regulatable flow rate comprising an enclosure filled with said vapor, means for heating said enclosure to a first temperature, a tube connected to the enclosure and means for heating said tube to a second regulatable temperature, the first temperature being maintained above the second temperature.

Preferably, the outlet tube is an electrical conductor and the means for heating said tube comprise a regulatable voltage source connected to the two ends of the tube, which is thus heated by the Joule effect.

As stated hereinbefore, such a source can be used with particular advantage in ion analyzer which it supplies with alkaline vapor. When the analyzer comprises an enclosure in which is disposed a target to be analyzed and a lens for extracting secondary ions whose front face faces the said target, the vapor outflow tube penetrates the enclosure, traverses the extraction lens and assumes a position flush with the front face of the extraction lens. This arrangement makes it possible to supply alkaline vapour under optimum conditions.

BRIEF DESCRIPTION OF THE DRAWINGS

Other advantages and features of the present invention can be gathered from the following description of a non-limitative embodiment with reference to the attached drawings, wherein show.

DETAILED DESCRIPTION OF THE PREFERRED EMBODIMENTS

Figure 1:
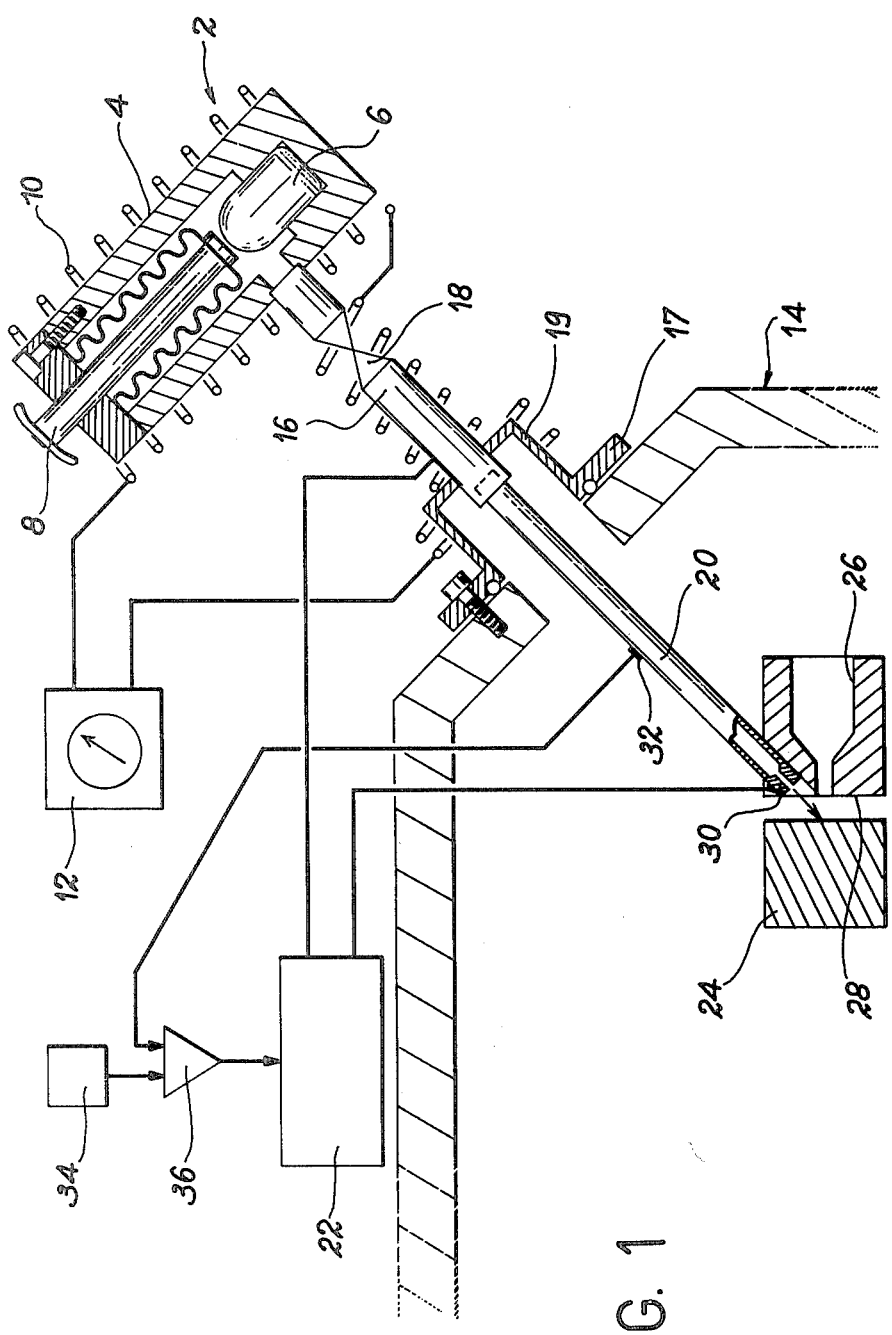
FIG. 1 a diagrammatic view of an ion analyzer equipped with an alkaline vapor source with a regulatable flow rate according to the invention.

The installation shown in FIG. 1 comprises an alkaline vapor source 2 comprising a tight enclosure 4 within which is disposed an ampoule 6 containing cesium. The enclosure is provided with means 8 for shattering the ampoule and permitting the cesium to the spread throughout the enclosure. The enclosure is brought to a first temperature by means of a flexible heating cord 10 supplied by a regulatable source 12.

The enclosure is connected to an ion analyzer 14 by a pipe 16 equipped with a sealing valve 18. Pipe 16 is advantageously connected to analyzer 14 by a tight clamp 17 to which it is connected by a tube 19, for example made from Monel metal to prevent heat losses. The device also comprises a metal tube 20. In the illustrated variant, this tube is heated by the Joule effect by means of a regulatable tension source 22 connected to the two ends of the tube. According to the invention, the temperature of tube 20 is below the temperature of enclosure 4.

Ion analyzer 14 comprises a sample target 24 to be analyzed and facing it an extraction lens 26, the other analyzer means (source of primary ions and analysis devices) being well known and not therefore shown.

The alkaline vapor outflow tube 20 traverses the extraction lens 26 and arrives flush with the front face 28 thereof by a small diameter end fitting 30.

Tube 20 is for example made from stainless steel and its end fitting 30 has for example an internal diameter of approximately 1 millimeter. The contraction of the end fitting provides a "venturi" effect and makes it possible to increase the discharge speed and decrease the cesium vapor pressure, which leads to a greater density of atoms for the same temperature.

As the cesium is at vapor - liquid equilibrium, to prevent liquid metal flowing through tube 20, the system is preferably arranged in such a way that source 2 is positioned below analyzer 14.

Obviously, tube 20 could be heated in some way other than the Joule effect and in particular by a heating resistor. However, the first solution would appear to be preferable because the tube is placed in the vacuum enclosure of the analyzer.

Figure 2:
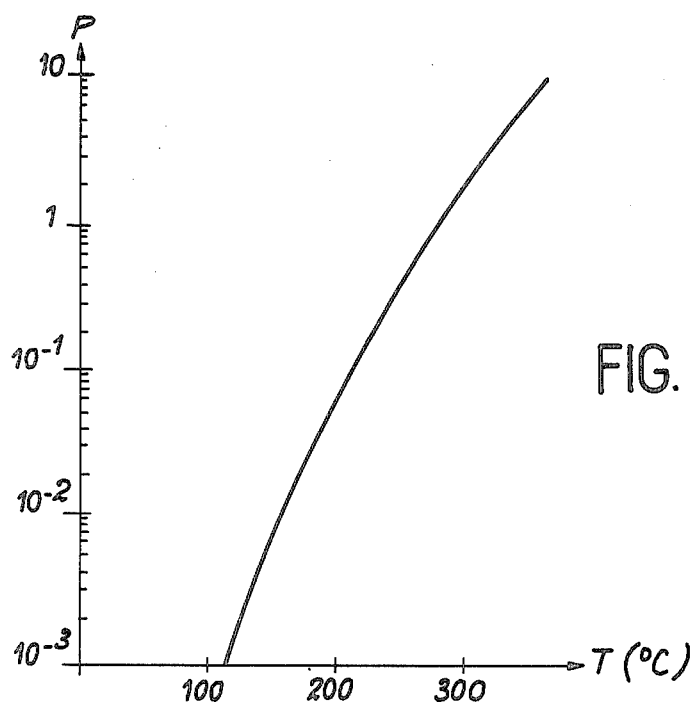
FIG. 2 a curve illustrating the variations of the saturating vapor tension of the cesium as a function of the temperature.

It is known that the pressure of a metal vapor contained in an enclosure of given volume is dependent on its temperature. FIG. 2 shows in exemplified manner the variation of the saturating vapor tension of the cesium as a function of temperature. When tube 20 and its end fitting 30 are brought to a particular temperature, a particular cesium pressure is established in the tube, which determines the cesium flow rate at the open end 30. In the application to ion analyzers, this flow rate must be regulated in such a way that saturation is just reached on the surface of the sample to be analyzed. If the flow rate is too high, the cesium layer deposited on the sample is to thick and the sample is no longer analyzed. Conversely, if the flow rate in inadequate, the secondary ion emission rate decreases and the analysis is falsified. The device according to the invention makes it possible to obtain this critical condition, which was not the case with the prior art sources.

Thus, the flow rate is controlled at the correct value by controlling the temperature of the tube 20 in such a way that it has a rated value. To this end, the installation shown in FIG. 1 comprises a probe 32 which measures the tube temperature, a regulatable generator 34 which supplies a reference signal, a comparator 36 which receives the signal supplied by probe 32 and the reference signal supplied by generator 34, said comparator supplying an error signal which is a function of the variation between the signals which it receives. The regulatable source 22 is then controlled by said error signal, which makes it possible to regulate the heating of the tube to the desired value.

In the operating range of the apparatus, the vapor pressure in enclosure 4 located upstream of the tube is always above that in the outlet tube, which means that the temperature of enclosure 4 is always above the tube temperature.

Figure 3:
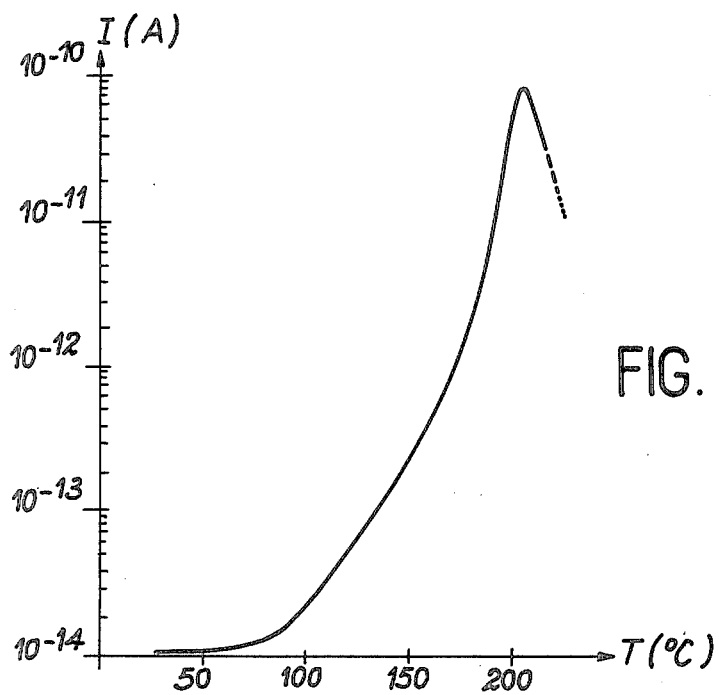
FIG. 3 another curve illustrating the variations of the secondary ion current supplied by an ion analyzer according to FIG. 1, as a function of the outlet tube of the source.

The curve of FIG. 3 illustrates the exultation of ion emission of copper 63 in the case of a brass sample bombarded with a primary beam of argon ions of intensity 0.9 $\mu$A and energy 14.5 KeV. In this graph, the secondary ion current expressed in amperes is plotted on the ordinate and the cesium outflow tube temperature is plotted on the abscissa. It is readily apparent that optimum ion emission is obtained for a given temperature of the outflow tube, which is advantageously used as the reference point for the control device.

The invention is not limited to the embodiments described and represented hereinbefore and various modifications can be made thereto without passing beyond the scope of the invention.

What is claimed is:

1. A metal vapor source with a regulatable flow rate comprising an enclosure filled with said vapor, means for heating said enclosure to a first temperature, a tube connected to the enclosure for restricted gas flow therefrom and means for heating said tube to a second regulatable temperature, the first temperature being maintained above the second temperature, and means for adjustably controlling the temperature of said tube to control said flow rate.

2. The metal vapor source according to claim 1, wherein the outlet tube is an electrical conductor and the heating means of said tube comprises a regulatable voltage source connected to the two ends of said tube.

3. The metal vapor source according to claim 1 wherein the outlet tube is provided with an end fitting, whose opening diameter is smaller than the internal diameter of the tube for increasing the vapor speed at the outlet tube.

4. An ion analyzer comprising an enclosure in which is disposed a target to be analyzed, a lens for extracting secondary ions whose front face faces the target, an enclosure filled with an alkaline vapor, means for heating said enclosure to a first regulatable temperature, a vapor outflow tube connected to one end of the enclosure for restricted gas flow thereto, while the other end penetrates the analyzer enclosure, traverses the extraction lens and assumes a position level with the front face of the extraction lens and means for heating said tube to a second regulatable temperature, the first temperature being kept above the second temperature of the outflow tube and means for adjustably controlling the temperature of said tube to control said flow rate.

* * * * *